(12) United States Patent
Janssen et al.

(10) Patent No.: US 11,163,240 B2
(45) Date of Patent: Nov. 2, 2021

(54) HEATING SYSTEM FOR AN OPTICAL COMPONENT OF A LITHOGRAPHIC APPARATUS

(71) Applicant: ASML Netherlands B.V., Veldhoven (NL)

(72) Inventors: Franciscus Johannes Joseph Janssen, Geldrop (NL); Marcus Adrianus Van De Kerkhof, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/809,497

(22) Filed: Mar. 4, 2020

(65) Prior Publication Data
US 2020/0201197 A1 Jun. 25, 2020

Related U.S. Application Data

(63) Continuation of application No. PCT/EP2018/069558, filed on Jul. 18, 2018.

(30) Foreign Application Priority Data

Sep. 4, 2017 (EP) .................................... 17189243

(51) Int. Cl.
*G03F 7/20* (2006.01)
*G02B 7/18* (2021.01)

(52) U.S. Cl.
CPC ....... *G03F 7/70891* (2013.01); *G02B 7/1815* (2013.01); *G03F 7/70191* (2013.01)

(58) Field of Classification Search
CPC .............. G03F 7/70891; G03F 7/1815; G03F 7/70191; G03F 7/70341
(Continued)

(56) References Cited

U.S. PATENT DOCUMENTS

| 9,588,435 B2 | 3/2017 | Fiolka |
| 2007/0096352 A1 | 5/2007 | Cochran et al. |

(Continued)

FOREIGN PATENT DOCUMENTS

| DE | 10 2010 003938 A1 | 10/2010 |
| DE | 10 2011 088740 A1 | 1/2013 |

(Continued)

OTHER PUBLICATIONS

PCT Notification of Transmittal of the International Search Report of the International Searching Authority dated Sep. 26, 2018, in the corresponding PCT International Application No. PCT/EP2018/069558 (2 pgs.).

*Primary Examiner* — Hung Nguyen
(74) *Attorney, Agent, or Firm* — Finnegan, Henderson, Farabow, Garrett & Dunner, LLP

(57) ABSTRACT

A system for heating an optical component of a lithographic apparatus, the system comprising a heating radiation source, the heating radiation source being configured to emit heating radiation for heating of the optical component, wherein the system is configured to direct the heating radiation emitted by the heating radiation source onto the optical component, a portion of the heating radiation being absorbed by the optical component and another portion of the heating radiation being reflected by optical component, and wherein the system is configured to vary or change a property of the heating radiation emitted by the heating radiation source such that the other portion of the heating radiation that is reflected by the optical component is constant during operation of the lithographic apparatus.

26 Claims, 10 Drawing Sheets

(58) Field of Classification Search
USPC .............................................. 355/30, 67–71
See application file for complete search history.

(56) References Cited

U.S. PATENT DOCUMENTS

| | | | | |
|---|---|---|---|---|
| 2013/0010275 A1* | 1/2013 | Medvedev | .......... | G03F 7/70575 |
| | | | | 355/71 |
| 2016/0377988 A1* | 12/2016 | Paul | .................... | G03F 7/70225 |
| | | | | 359/355 |
| 2017/0123118 A1* | 5/2017 | Bittner | ................. | G02B 5/0891 |

FOREIGN PATENT DOCUMENTS

| | | |
|---|---|---|
| DE | 10 2016 209876 A1 | 4/2017 |
| DE | 10 2017 207862 A1 | 7/2017 |
| KR | 20010076784 A | 8/2001 |
| WO | WO 2014/012660 A2 | 1/2014 |
| WO | WO 2019/042656 A1 | 3/2019 |

* cited by examiner

HEATING SYSTEM FOR AN OPTICAL COMPONENT OF A LITHOGRAPHIC APPARATUS

CROSS-REFERENCE TO RELAYED APPLICATIONS

This application claims priority to International Application No. PCT/EP2018/069558, filed Jul. 18, 2018, and published as WO 2019/042656 A1, which claims priority of EP application No. 17189243.3 which was filed on Sep. 4, 2017. The contents of these applications are incorporated herein in their entireties by reference.

FIELD

The embodiments of the present disclosure relate to a system for heating an optical component of a lithographic apparatus and associated apparatus and methods.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

In use, the EUV radiation may be turned on and off in the lithographic apparatus. This may induce heat loads, such as for example dynamic heat loads, on one or more components of the lithographic apparatus. For example, the lithographic apparatus may comprise a projection system. The projection system may comprise one or more optical components, which are configured to project the pattern from the patterning device on the substrate.

The one or more optical components may be heated. The heating of the one or more components may be varied depending on whether the EUV radiation is turned on or off to keep the heat load on the one or more optical components constant. Some heat may be reflected from the optical components onto one or more other components of the projection system. The one or more other components may be configured to mount the optical components and/or to provide a reference element for a position measurement of the one or more optical components. As the heating of the one or more optical components may be varied depending on whether the EUV radiation is turned on or off, the amount of heat reflected on the one or more other components may also vary. This may lead to dynamic heat loads acting on the one or more other components. The dynamic heat loads acting on the one or more other components may effect a position of one or more optical components, which may lead to a deviation of the patterned beam on the substrate. This in turn may lead to errors in the pattern to be formed on the substrate, for example, overlay errors, in which one part of a pattern is not correctly positioned relative to another pattern.

SUMMARY

According to an aspect, there is provided a system for heating an optical component of a lithographic apparatus, the system comprising a heating radiation source, the heating radiation source being configured to emit heating radiation for heating of the optical component, wherein the system is configured to direct the heating radiation emitted by the heating radiation source onto the optical component, a portion of the heating radiation being absorbed by the optical component and another portion of the heating radiation being reflected by optical component, and wherein the system is configured to vary or change a property of the heating radiation emitted by the heating radiation source such that the other portion of the heating radiation that is reflected by the optical component is constant during operation of the lithographic apparatus.

Because the portion of the heating radiation reflected by the mirror is constant during operation of the lithographic apparatus, the heat load on other components of the lithographic apparatus may be constant. This may reduce or prevent a change in the position of the optical component and/or the other components and/or may reduce or prevent a deviation of a patterned radiation beam which is reflected by the optical component. This in turn may reduce errors in a pattern to be formed on the substrate by the lithographic apparatus.

The property may comprise at least one of the following: a polarisation, polarisation state, intensity, power and wavelength of the heating radiation emitted by the heating radiation source.

The system may comprise a first configuration, in which the heating radiation directed onto the optical component comprises a first property, and a second configuration, in which the heating radiation directed onto the optical component comprises a second property.

The first property may comprise at least one of a first wavelength, a first polarisation state, a first power and a first intensity. The second property may comprise at least one of a second wavelength, a second polarisation state, a second power and a second intensity.

In the first polarisation state, the heating radiation may comprise polarised or p-polarised heating radiation.

In the second polarisation state, the heating radiation may comprise polarised or p-polarised heating radiation and/or unpolarised or s-polarised heating radiation.

The second wavelength may be longer than the first wavelength.

The first wavelength may comprise a wavelength of about 1 μm and the second wavelength may comprise a wavelength of about 2 μm.

The system may comprise a controller, the controller being configured to operate the system between the first configuration and the second configuration.

The controller may be configured to operate the system in the first configuration when no radiation, such as extreme ultraviolet radiation, is present in the lithographic apparatus and in the second configuration when radiation, such as extreme ultraviolet radiation, is present in the lithographic apparatus.

The system may be operated from the first configuration to the second configuration, the controller being configured to vary or change a ratio between the polarised or s-polarised heating radiation and the unpolarised or p-polarised heating radiation to maintain the other portion of the heating radiation that is reflected by the optical component constant.

The system may comprise an apparatus for varying or changing at least one property of the heating radiation emitted by the heating radiation source.

The apparatus may comprise an optical device for varying or changing the at least one property of the heating radiation emitted by the heating radiation source.

The optical device may be configured for dividing the heating radiation emitted by the heating radiation source into a first radiation portion and a second radiation portion, the first radiation portion comprising a first polarisation and the second radiation portion comprising a second polarisation.

The apparatus may comprise an attenuating element, the attenuating element being configured to allow a ratio between the first radiation portion and the second light portion to be varied or changed.

The system may comprise a plurality of heating radiation sources.

The plurality of heating radiation sources may define an array of heating radiation sources.

The system may be configured to vary or change the property of the heating radiation emitted by at least one heating radiation source of the plurality of light sources or each heating radiation source of the plurality of heating radiation sources.

The system may comprise an apparatus for varying or changing at least one property of the heating radiation emitted by the at least one heating radiation source of the plurality of heating radiation sources or each heating radiation source of the plurality of heating radiation sources.

The apparatus may comprise an optical device for varying or changing the at least one property of the heating radiation emitted by the at least one heating radiation source of the plurality of heating radiation sources.

The apparatus may comprise a plurality of optical devices, each optical device being associated with a respective heating radiation source of the plurality of heating radiation sources to allow the at least one property of the heating radiation emitted by each heating radiation source of the plurality of heating radiation sources to be varied or changed.

The plurality of optical devices may comprise a first optical device configured to allow passage of heating radiation comprising a first polarisation and a second optical device configured to allow passage of heating radiation comprising a second polarisation.

At least one radiation source of the plurality of radiation sources may be associated with the first optical device and at least one other radiation source of the plurality of radiation sources may be associated with the second optical device, the at least one radiation source, the at least one other radiation source and the first and/or second optical devices being be arranged for heating of an area or location of the optical component.

The heating radiation source may comprise a tuneable or variable heating radiation source to allow the property of the heating radiation emitted by the heating radiation source to be varied or changed.

The system may comprise at least two heating radiation sources, at least one of the at least two heating radiation sources being configured for emitting heating radiation comprising the first property and at least one other of the at least two second heating radiation sources being configured for emitting light comprising the second property.

The controller may be configured to vary or change at least one other property of heating radiation emitted by the heating radiation source or at least one heating radiation source of the plurality of light sources or each heating radiation source of the plurality of heating radiation sources.

According to an aspect, there is provided a lithographic apparatus comprising an illumination system configured to condition a radiation beam, a support structure constructed to support a patterning device, the patterning device being capable of imparting the radiation beam with a pattern in its cross-section to form a patterned radiation beam, a substrate table constructed to hold a substrate, and a projection system configured to project the patterned radiation beam onto the substrate, wherein the projection system comprises a system for heating an optical component of the lithographic apparatus according to any preceding claim.

According to an aspect, there is provided a method comprising emitting heating radiation for heating of an optical component of a lithographic apparatus, directing the heating radiation onto the optical component; a portion of the heating radiation being absorbed by the optical component and another portion of the heating radiation being reflected by optical component, and varying or changing a property of the emitted heating radiation such that the portion of the heating radiation that is reflected by the optical component is constant during operation of the lithographic apparatus.

Features of different aspects may be combined with each other. For example, optional features of the one aspect of the disclosed embodiments may be combined with the other aspects of the disclosed embodiments.

BRIEF DESCRIPTION OF THE DRAWINGS

Embodiments of the present disclosure will now be described, by way of example only, with reference to the accompanying schematic drawings, in which.

DETAILED DESCRIPTION

Figure 1:
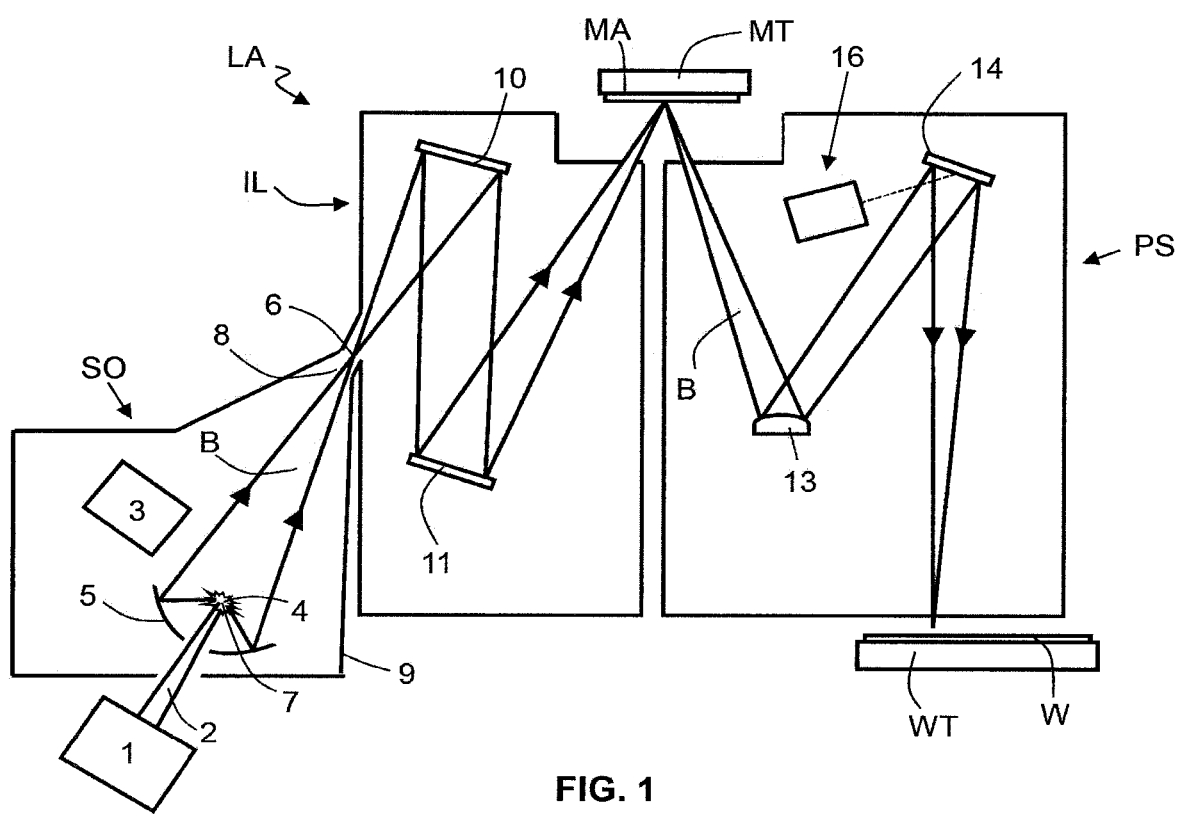
FIG. 1 depicts a lithographic system comprising a lithographic apparatus and a radiation source according to embodiments of the present disclosure.

FIG. 1 shows a lithographic system. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously limited patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two ellipse focal points. A first focal point may be at the plasma formation region 4, and a second focal point may be at an intermediate focus 6, as discussed below.

The laser 1 may be remote from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular intensity distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of optical components 13, 14, which may be provided in the form of plurality of mirrors and which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

FIG. 1 also schematically depicts a lithographic system including a system for heating an optical component of a lithographic apparatus according to one embodiment of the present disclosure. The optical component may be provided in the form of at least one of the mirrors 13, 14 of the projection system PS depicted in FIG. 1. However, it will be appreciated that in other embodiments the system 16 may be used to heat other optical components of the lithographic apparatus LA in addition to or instead of the at least one mirror of the projection system.

Figure 2A:
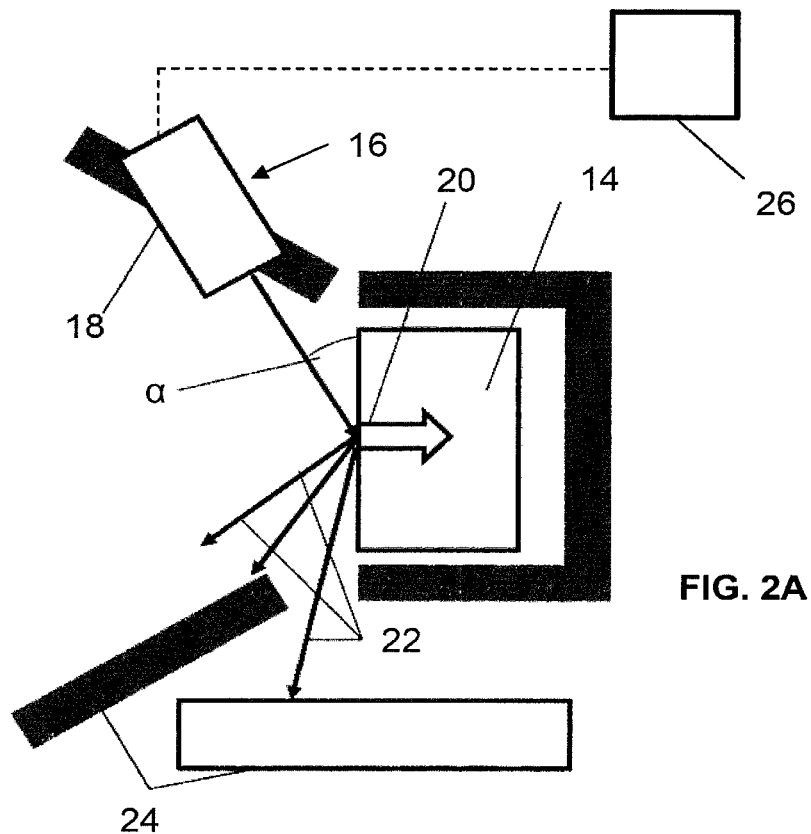
FIGS. 2A and 2B depict a system for heating an optical component according to embodiments of the present disclosure.
Figure 2B:
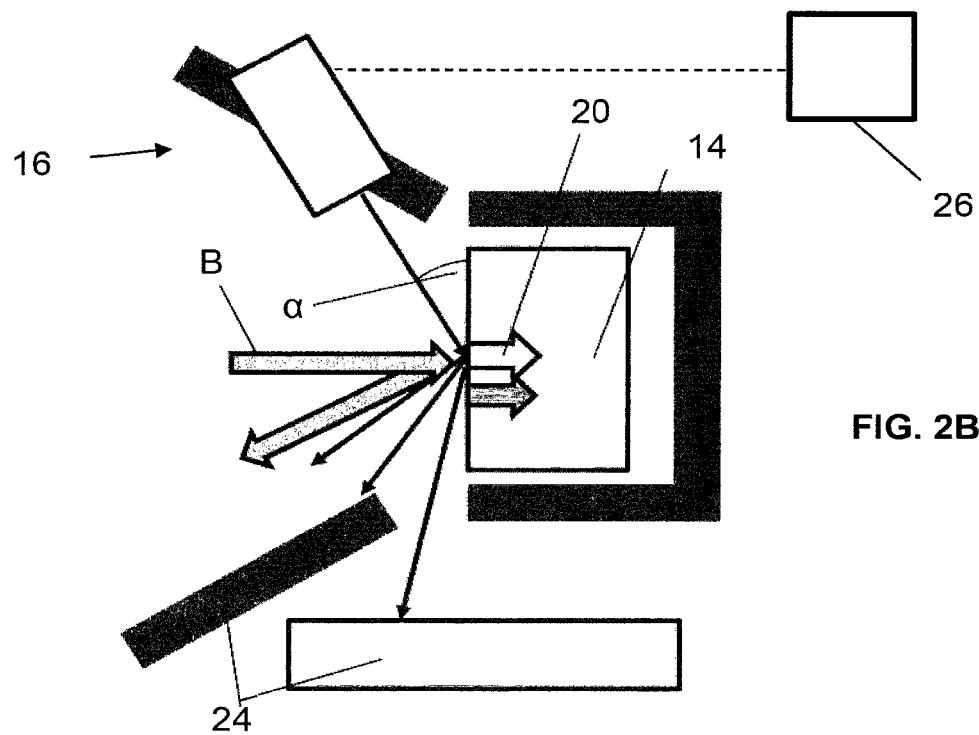

FIGS. 2A and 2B schematically depict the system 16 for heating the optical component in more detail. The system 16 comprises a heating radiation source, which may be provided in the form of a laser 18, such as for example an infrared laser. The laser 18 is configured to emit heating radiation for heating of the mirror 14. For example, the laser 18 may be configured to emit heating radiation comprising a wavelength in the range of about 1 µm to 2 µm, such as for example about 1.5 µm. The term "heating radiation" may be considered as encompassing infrared light or infrared radiation. It will be appreciated that the laser disclosed herein is not limited to emitting heating radiation comprising a wavelength in the range of about 1 µm to 2 µm. For examples, in other embodiments the laser may be configured or provided to emit heating radiation comprising a range of about 0.5 to 10 μm.

The system is configured to direct the heating radiation emitted by the laser 18 onto the mirror 14. A portion 20 of the heating radiation is absorbed by the mirror 14 and another portion 22 of the heating radiation is reflected by the mirror 14. The system 16 is configured for varying or changing a property of the heating radiation emitted by the laser 18 such that the other portion of the heating radiation that is reflected by the mirror 14 is constant during operation of the lithographic apparatus LA. The system 16 may be configured for varying or changing the property of the heating radiation emitted by the laser 18 such that heat absorbed by the mirror 14, e.g. due to the radiation beam B and the portion 20 of the heating radiation, is constant during operation of the lithographic apparatus LA, as will be described below.

The term "constant" may be considered as encompassing substantially constant. Both the terms "constant" and "substantially constant" may be interchangeably used.

The other portion 22 of the heating radiation may be reflected by the mirror 14, for example, towards another component 24 of the lithographic apparatus LA. The term "other component" may be considered as encompassing one or more components of the lithographic apparatus that are arranged in proximity of the mirror or surround the mirror. For example, the other component 24 of the lithographic apparatus LA may be or comprise a reference element, a mounting element and/or a portion or all of an enclosure, as will be described below. By configuring the system such that the other portion of the heating radiation reflected by the mirror is constant during operation of the lithographic apparatus, the heat load the other component may be constant. This may reduce or prevent a change in the position of the mirror and/or the other component and/or may reduce or prevent a deviation of the patterned beam on the substrate. This in turn may reduce errors in the pattern to be formed on the substrate, for example, overlay errors, in which one part of a pattern is not correctly positioned relative to another pattern.

The terms "to vary or change the property of the heating radiation emitted by the laser" may be considered as encompassing varying or changing the property of a portion or all of the heating radiation emitted by the laser.

The terms "operation of the lithographic apparatus" may be considered as encompassing operation of the lithographic apparatus between a first configuration of the lithographic apparatus in which no EUV radiation (e.g. substantially no EUV radiation) is present in the lithographic apparatus and a second configuration of the lithographic apparatus in which EUV radiation is present in the lithographic apparatus, for example during exposure of a substrate. In other words, in the first configuration of the lithographic apparatus, the EUV radiation may be turned off and in the second configuration, the EUV radiation may be turned on.

FIG. 2A schematically depicts the system 16 when no EUV radiation is present in the lithographic apparatus, e.g. the first configuration thereof. FIG. 2B schematically depicts the system 16 when EUV radiation is present in the lithographic apparatus, e.g. in the second configuration thereof. It can be seen in FIG. 2B that the mirror 14 is arranged to reflect the radiation beam B, for example towards the substrate, as described above. A portion 20 of the radiation beam B may be absorbed by the mirror 14 and contribute to the heating of the mirror 14. This may require the property of the heating radiation emitted by the laser 18 to be varied or changed by the system 16 such that heat absorbed by the mirror 14, e.g. due to the radiation beam B and the portion 20 of the heating radiation is constant during operation of the lithographic apparatus LA. The property of the heating radiation emitted by the laser 18 may be varied or changed such that another portion of the heat reflected by the mirror 14, e.g. due to the other portion 22 of the heating radiation, towards the component is constant during operation of the lithographic apparatus LA.

The property of the heating radiation may be or comprise at least one of a polarisation, polarisation state, intensity, power and/or wavelength of the heating radiation emitted by the laser 18. Variations or changes in the intensity of the heating radiation may be considered as encompassing variations or changes in the power of the heating radiation.

The system 16 may comprises a first configuration in which the heating radiation directed onto the mirror comprises a first property and a second configuration in which the heating radiation directed on the mirror 14 comprises a second property. The first property may comprise at least one of a first polarisation state, a first wavelength, a first power and a first intensity. The second property may comprise at least one of a second wavelength, a second polarisation state a second power and a second intensity.

In the first polarisation state, the heating radiation may comprise polarised heating radiation or p-polarised heating radiation. P-polarised heating radiation may be considered as heating radiation having an electric field component that is parallel (e.g. substantially parallel) to a plane of incidence. In this embodiment, the mirror 14 or a surface thereof may be considered as the plane of incidence. P-polarisation of the heating radiation may also be referred to as transverse-magnetic (TM).

In the second polarisation state, the heating radiation may comprise polarised or p-polarised heating radiation and unpolarised heating radiation or s-polarised heating radiation. Unpolarised heating radiation may be considered as encompassing heating radiation having a random polarisation or heating radiation having a distribution of polarisations. S-polarised heating radiation may be considered as heating radiation having an electric field component that is perpendicular to the plane of incidence. S-polarisation of heating radiation may also be referred to as transverse-electric (TB). However, it will be appreciated that in other embodiments, in the second polarisation state, the heating radiation may only comprise unpolarised or s-polarised heating radiation.

As described above, the property of the emitted heating radiation may additionally or alternatively comprise a wavelength of the emitted heating radiation. The first property of the heating radiation may comprise the first wavelength and the second property of the heating radiation may comprise the second wavelength. The second wavelength may be longer than the first wavelength. For example, the first wavelength comprises a wavelength of about 1 μm and the second wavelength may comprise a wavelength of about 2 μm, as will be described in more detail below.

The system 16 may be configured to be operated between the first configuration and the second configuration. For example, system 16 may be operated in the first configuration when no EUV radiation is present in the lithographic apparatus, e.g. the first configuration thereof, and in the second configuration when EUV radiation is present in the lithographic apparatus, e.g. the second configuration thereof.

Referring to FIGS. 2A and 2B, the system 16 may comprise a controller 26. The controller 26 may be arranged outside of the vacuum environment of the lithographic apparatus, e.g. the projection system PS. However, it will be appreciated that in other embodiments the controller may be part of the projection system or be arranged inside the projection system. The controller 26 may be configured to operate the system 16 between the first and second configuration. For example, the controller 26 is configured to operate the system 16 in the first configuration, when no EUV radiation is present in the lithographic apparatus, e.g. the first configuration thereof, and in the second configuration, when EUV radiation is present in the lithographic apparatus, e.g. the second configuration thereof.

Figure 3:
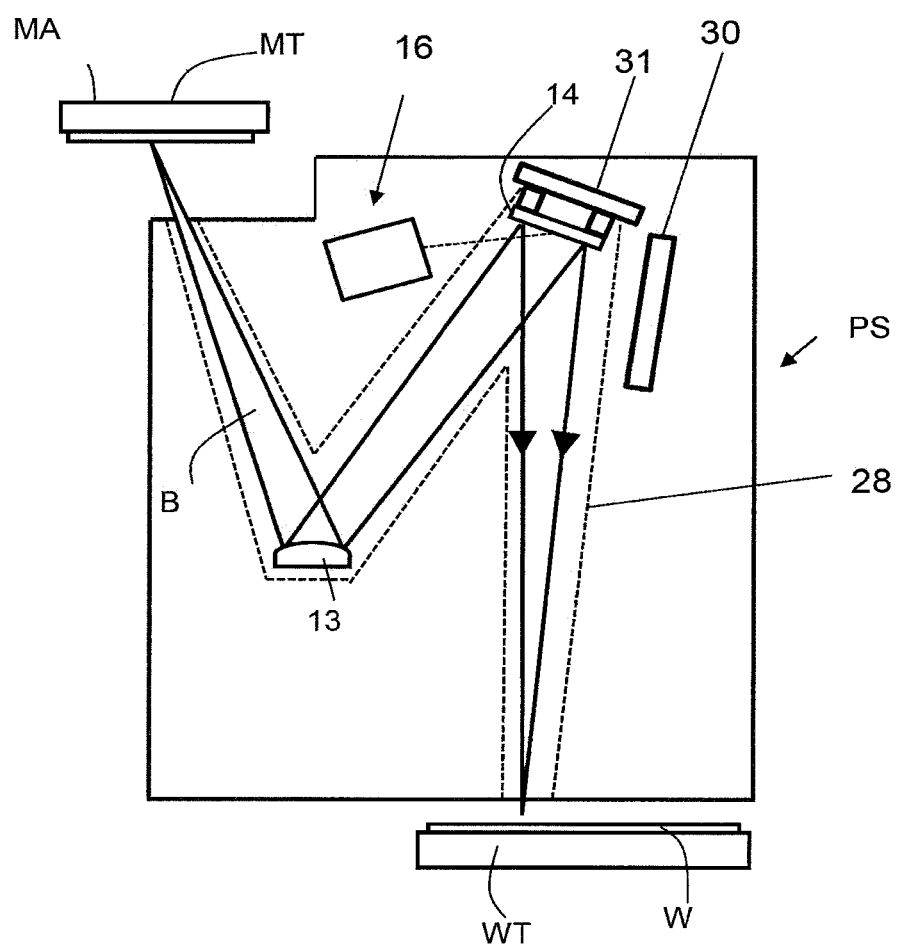
FIG. 3 depicts a projection system of the lithographic apparatus of FIG. 1 comprising the system of FIGS. 2A and 2B.

FIG. 3 schematically depicts the projection system of the lithographic apparatus LA depicted in FIG. 1. The lithographic apparatus LA may comprise an enclosure 28 that at least partially or substantially surrounds the radiation beam B. The enclosure 28 may be arranged to prevent or reduce contamination from reaching the optical components, e.g. mirror 13, 14, of the projection system PS.

As described above, heating radiation may be reflected by the mirror 14 towards the other component of the lithographic apparatus. The at least one other component may be or comprise a reference element, a mounting element and/or a portion or all of the enclosure 28. The reference element may be provided in a form of a sensor frame 30. The sensor frame 30 may be arranged in the projection system PS such that the sensor frame 30 provides a reference for the position of the mirror 14. In other words, a position of the mirror 14 may be measured or determined relative to the sensor frame 30. The mounting element may be provided in the form of a force frame 31. The force frame 31 may be configured to mount an optical component of the lithographic apparatus, such as for example the mirror 14.

A change in the position of the sensor frame 30 and/or force frame 31, for example due to heat acting on the sensor frame 30 and/or force frame 31, may affect or influence a position of the mirror 14 and/or may lead to a deviation of the patterned beam on the substrate. This in turn may cause errors in the pattern to be formed on the substrate, for example, overlay errors, in which one part of a pattern is not correctly positioned relative to another pattern. For example, heat acting on the sensor frame 30 may influence or affect a measurement or determination of the position of the mirror 14. Heat acting on the force frame 31 may additionally or alternatively disturb the sensor frame 30. The disturbance of the sensor frame 30, e.g. due to heat acting on the force frame 31, may influence or affect the measurement or determination of the position of the mirror 14. By configuring the system such that the other portion of the heating radiation reflected by the mirror is constant during operation of the lithographic apparatus, the heat load on the other component, e.g. one or more components in proximity of the mirror surrounding the mirror may be constant. This may reduce or prevent a change in the position of the sensor frame and/or the force frame and/or may reduce or prevent a deviation of the patterned beam on the substrate.

Figure 4:
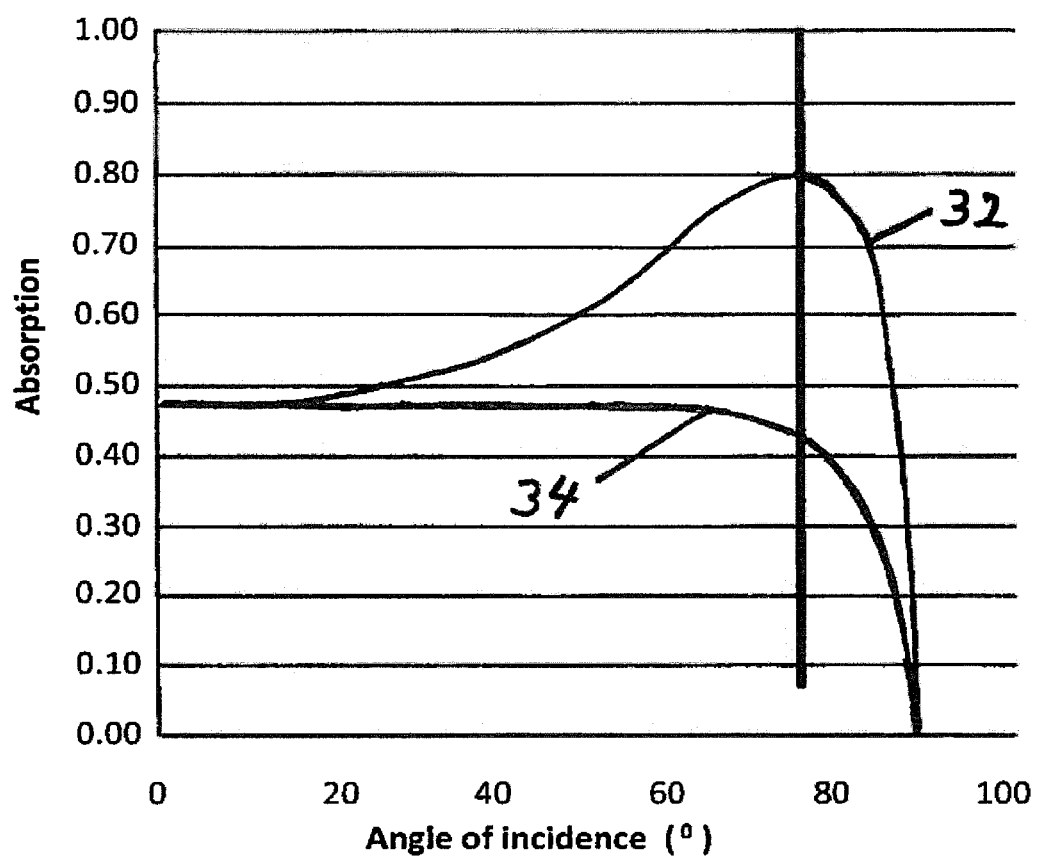
FIG. 4 depicts a graph of the absorption of polarised or p-polarised heating radiation and unpolarised or s-polarised heating radiation in dependence of an angle of incidence of the heating radiation on the optical component of the lithographic apparatus of FIG. 1.

FIG. 4 depicts a graph of the absorption of polarised or p-polarised heating radiation 32 and unpolarised or s-polarised heating radiation 34 in dependence of an angle of incidence of the heating radiation on the mirror 14. In other words, the absorption of polarised or p-polarised 32 and unpolarised or s-polarised heating radiation 34 depends on an angle of incidence of the heating radiation relative to the mirror 14. The angle of incidence a of the heating radiation relative to the mirror 14 is indicated in FIGS. 2A and 2B. It can be seen from FIG. 4 that for angles of incidence of about 20° to 90° the absorption of polarised or p-polarised heating radiation 32 is larger than the absorption of unpolarised or s-polarised heating radiation 34. For example, at an angle of incidence a of about 75° about 80% of the polarised or p-polarised heating radiation 32 is absorbed by the mirror 14. The dependence of the absorption of polarised or p-polarised and unpolarised or s-polarised heating radiation on the angle of incidence a may be at least partially due to Brewster's law.

As described above, when no EUV radiation is present in the lithographic apparatus, the heating radiation that is directed on the mirror 14 by the system 16 comprises the first property, which may be or comprise the first polarisation state. This may allow a relatively larger amount of light to be absorbed by the mirror 14, e.g. due to the absorption of polarised or p-polarised light being larger than the absorption of unpolarised or s-polarised by the mirror 14. When the lithographic apparatus is operated from the first configuration to the second configuration, e.g. radiation is present in the lithographic apparatus LA, the system 16 may be operated from the first configuration into the second configuration. When EUV radiation is present in the lithographic apparatus, the heating radiation that is directed on the mirror 14 by the system 16 comprises the second property, which may be or comprise the second polarisation state. This may allow a relatively lower amount of heating radiation to be absorbed by the mirror 14, e.g. due to the absorption of unpolarised or s-polarised heating radiation being lower than the absorption of polarised or p-polarised heating radiation by the mirror 14. By allowing a relatively lower amount of heating radiation to be absorbed by the mirror 14, the system 16 may compensate for the absorption of a portion of the radiation beam B by the mirror 14 and/or maintain the heat load on the mirror 14 constant.

Heating radiation that is not absorbed by the mirror 14 may be reflected, e.g. towards the other component 24 of the lithographic apparatus. As described above, when no EUV radiation is present in the lithographic apparatus the heating radiation directed onto the mirror 14 by the system 16 comprises the first property, e.g. the first polarisation state. This may allow a relatively lower amount of heating radiation to be reflected by the mirror 14, e.g. due to the absorption of polarised or p-polarised light being larger than the absorption of unpolarised or s-polarised by the mirror 14. When the lithographic apparatus is operated from the first configuration into the second configuration, e.g. EUV radiation is present in the lithographic apparatus, the 16 system may be operated from the first configuration into the second configuration. When EUV radiation is present in the lithographic apparatus, the heating radiation directed onto the mirror 14 by the system 16 comprises the second property, e.g. the second polarisation state. As described above, in the second polarisation state, the heating radiation directed onto the mirror 14 by the system 16 comprises polarised or p-polarised heating radiation and unpolarised light or s-polarised heating radiation. The controller 26 may be configured to vary or change a ratio between the polarised or p-polarised heating radiation and the unpolarised or s-polarised heating radiation to maintain the other portion 22 of the heating radiation that is reflected by the mirror 14 constant. This may be due to the reflection of unpolarised or s-polarised light being larger than the reflection of polarised or p-polarised by the mirror 14, as will be described below.

For example, the angle of incidence a of the heating radiation on the mirror 14 may be selected such that about 80% of the polarised or p-polarised heating radiation may absorbed by the mirror 14 and about 20% of the polarised or p-polarised light may reflected by the mirror 14. The angle of incidence a of the heating radiation on the mirror 14 may be selected such that about 45% of the unpolarised or s-polarised heating radiation may be absorbed by the mirror 14 and about 55% of the unpolarised heating radiation or s-polarised heating radiation may be reflected by the mirror 14. For example, the angle of incidence a of the heating radiation relative to the mirror 14 may be selected to be between about 60° and 80°, such as for example about 75°. In use, an exemplary heat load of about 4 W may be required to heat the mirror 14 to reach a pre-determined temperature. The pre-determined temperature may be in the region of about 30 to 35° C. When no EUV radiation is present in the lithographic apparatus, e.g. the first configuration thereof, the system 16 may be in the first configuration. In the first configuration of the system 16, an intensity or power of the polarised or p-polarised heating radiation directed on the mirror 14 may be selected to be about 5 W. A portion of the polarised or p-polarised heating radiation having a power of about 4 W is absorbed by the mirror 14. This causes heating of the mirror 14. Another portion of the polarised or p-polarised heating radiation having a power of about 1 W is reflected by the mirror 14 e.g. towards the other component 24 of the lithographic apparatus.

When the lithographic apparatus is operated from the first configuration into the second configuration, the system 16 may be operated from the first configuration into the second configuration. In other words, the radiation beam B is directed on the mirror 14. For example, when a portion of the radiation beam B having a power or intensity of about 2.5 W is absorbed by the mirror 14, the power or intensity of the heating radiation absorbed by the mirror 14 needs to be reduced to about 1.5 W, e.g. to maintain a constant heat load on the mirror 14. In the second configuration of the system 16, the intensity or power of the heating radiation may be varied or changed so that the polarised or p-polarised heating radiation has a power of about 1 W and the unpolarised or s-polarised heating radiation has an intensity or power of about 1.5 W. This may result in a portion of the heating radiation having a power or intensity of about 1.5 W to be absorbed by the mirror 14 and another portion of the heating radiation having a power or intensity of about 1 W to be reflected by the mirror 14, e.g. towards the other component 24 of the lithographic apparatus. This may allow the heat load on the mirror and/or the other component of the lithographic apparatus to be maintained constant during operation of the lithographic apparatus. From the above description, it will be appreciated that the intensity or power of the heating radiation may be varied or changed in addition to the polarisation state of the heating radiation. It should be understood that the intensity or power levels described above are exemplary and the system is not limited to using polarised (or p-polarised) and/or unpolarised (or s-polarised) heating polarisation having the described powers or intensities.

Figure 5A:
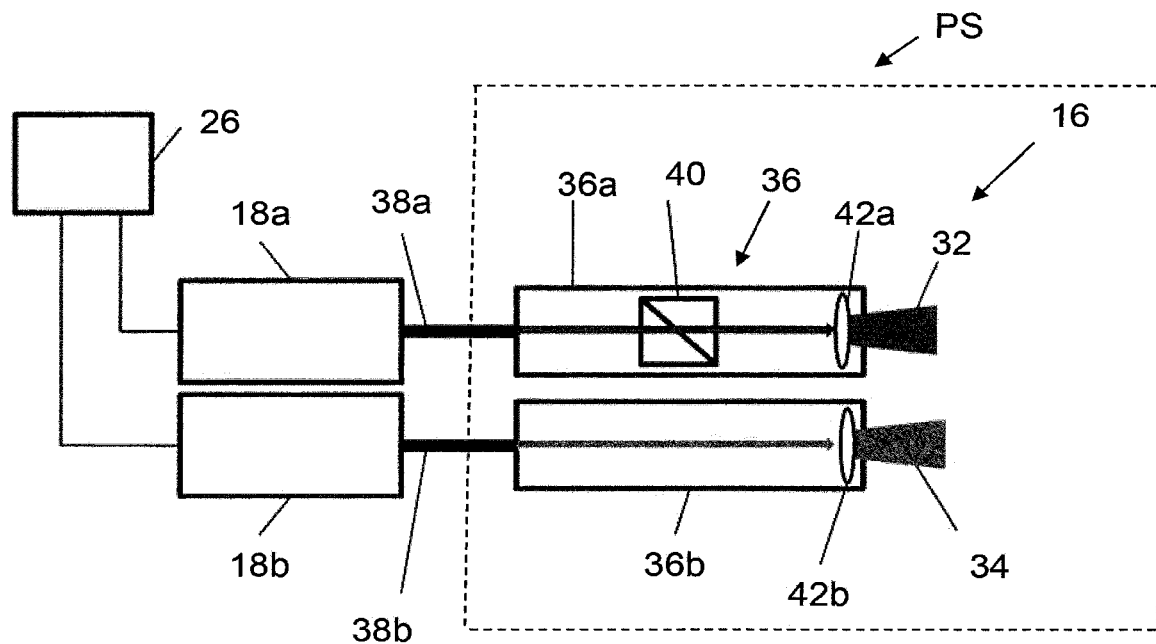
FIG. 5A depicts an embodiment of the system for heating an optical component of a lithographic apparatus.

FIG. 5A schematically depicts an embodiment of the system 16 for heating an optical component of a lithographic apparatus. The system 16 comprises a first laser 18 and a second laser 18b. The first and second lasers 18a, 18b may comprise any of the features of the laser 18, described above.

The system 16 comprises an apparatus 36 for varying or changing at least one property of the heating radiation emitted by the first and second lasers 18a, 18b. In this embodiment the first and second lasers 18a, 18b are arranged separately from the apparatus 36. This arrangement of the system 16 may allow the first and second lasers 18a, 18h to be arranged outside of the vacuum environment of the projection system PS, which is indicated in FIG. 5A by the dashed line. However, it will be appreciated that in other embodiments the first and second lasers may be part of or comprised in the apparatus.

Heating radiation emitted by the first and second lasers 18a, 18b may be directed, transmitted or transferred to the apparatus 36 by one or more transmission elements 38, such as for example one or more optical fibres, two of which 38a, 38b are depicted in FIG. 5A. It will be appreciated that in other embodiments more or less than two transmission elements may be used.

In the embodiment depicted in FIG. 5A, the apparatus 36 comprises a first portion 36a and a second portion 36b. At least one of the first and second portions of the apparatus may be configured to vary the property of the heating radiation emitted by the lasers 18a, 18h. The first portion 36a of the apparatus 36 may be associated with the first laser 18a and the second portion of the apparatus 36h may be associated with the second laser 18b. In other words, heating radiation emitted by the first laser 18a may be transmitted to the first portion 36a of the apparatus 36 by a first transmission element 38a and heating radiation emitted by the second laser 18b may be transmitted to the second portion 36b of the apparatus 36 by a second transmission element 38b.

In this embodiment the first portion 36a of the apparatus 36 is configured to vary the at least one property of the heating radiation emitted by the first laser 18a. The apparatus 36 may comprise an optical device 40 for varying or changing the at least one property of the heating radiation emitted by the first laser 18a. The optical device 40 may be configured to vary or change a polarisation of the heating radiation emitted by the first laser 18a. For example, the optical device 40 may be provided in the form of a wave plate, e.g. a quarter-wave plate or half-wave plate, a beam splitter, e.g. a polarising beam splitter, or polarising grating or the like. It will be appreciated that in other embodiments the optical device may be configured to vary or change a wavelength of the light emitted by the laser. For example, the optical device may be provided in the form of a wavelength-selective optical device, such as a for example a grating or the like. In such embodiments, the optical device may be part of or comprised in the laser.

The light emitted by the first and second lasers 18a, 18b is transmitted by the transmission elements 38a, 38b to the respective first and second portion 36a, 36b of the apparatus 36. The optical device 40, which is arranged in the first portion 36a of the apparatus, may vary or change the at least one property of the heating radiation emitted by the first laser 18a. Although the optical device is depicted in FIG. 5A as being arranged in the first portion 36a of the apparatus 36, it will be appreciated that in other embodiments, the optical device may be arranged in the second portion of the apparatus or be arranged outside of the vacuum environment of the projection system.

In the embodiment depicted in FIG. 5A the optical device 40 is configured for dividing the heating radiation emitted by the first laser 18a into a first radiation portion and a second radiation portion (not depicted). The first radiation portion comprising a first polarisation, such as for example a p-polarisation, and the second radiation portion comprising a second polarisation, such as for example a s-polarisation. For example, the optical device 40 may be provided in the form of a polarising beam splitter. The heating radiation emitted by the first and second lasers 18a, 18b may be considered to be unpolarised. The optical device 40 may be arranged to divide the heating radiation emitted by the first laser 18a into the first and second radiation portions. In this embodiment, the optical device 40 may be configured to allow transmission of the first radiation portion 32, which is p-polarised, while the second radiation portion, which is s-polarised (not depicted in FIG. 5A), is reflected at an angle of about 90° and is not directed onto the mirror 14.

The second portion 36b of the apparatus 36 may be configured to allow passage of the unpolarised heating radiation 34 emitted by the second laser 18b. The first and second portions 36a, 36h of the apparatus may be configured to change or impart a shape of the heating radiation emitted by the respective first and second laser 18a, 18b. For example, the first and second portions 36a, 36h of the apparatus 36 may comprise respective first and second optical elements 42a, 42b, which may each be provided in the form of a lens, to for directing the heating radiation passing through the apparatus 36 onto the mirror 14 and/or changing or imparting a shape of the heating radiation. The first and second portions 36a, 36b of the apparatus 36 may also be considered as first and second heating heads. Although the first and second optical elements are described as being part of the apparatus, it will be appreciated that in other embodiments the first and second optical elements may be provided separately from the apparatus. Additionally, in other embodiments, the system may comprise more or less than two optical elements.

As described above, the system 16 may comprise a controller 26 configured to operate the system 16 between the first configuration, in which the heating radiation that is directed onto the mirror comprises the first property, e.g. the first polarisation state and the second configuration, in which the heating radiation that is directed onto the mirror 14 comprises the second property, e.g. the second polarisation state. For example, the controller 26 may be configured to operate the first and second lasers 18a, 18b so that only the first laser emits heating radiation, which is subsequently p-polarised and directed onto the mirror 14 by the first portion 36a of the apparatus 36, when no EUV radiation is present in the lithographic apparatus, e.g. the first configuration thereof. When the lithographic apparatus is operated from the first configuration to the second configuration, the controller may operate the system 16 into the second configuration. In the second configuration of the system 16, the controller 26 may be configured to operate the first and second lasers 18a, 18h so that the first and second lasers 18a, 18h emit heating radiation. Heating radiation emitted by the first laser 18a may be p-polarised and directed onto the mirror 14 by the first portion 36a of the apparatus 36 and heating radiation emitted by the second laser 18b may be directed onto the mirror 14 by the second portion 36b. Additionally, the controller 26 may be configured to vary or change at least one other property of the heating radiation emitted by the first and second lasers 18a, 18b. For example, the controller 26 may be configured to vary or change the intensity or power of the heating radiation emitted by first and second lasers 18a, 18h, e.g. between a first intensity or power and a second intensity or power, e.g. so that the heat load on the mirror 14 and/or the other component 24 of the lithographic apparatus is constant during operation of the lithographic apparatus. For example, the second intensity or power may be lower than the first intensity or power. The controller 26 may be configured to vary or change a ratio between the p-polarised heating radiation 32 and the unpolarised heating radiation 34 to maintain the other portion of the heating radiation that is reflected by mirror 14 constant, when the system 16 is operated into the second configuration.

Figure 5B:
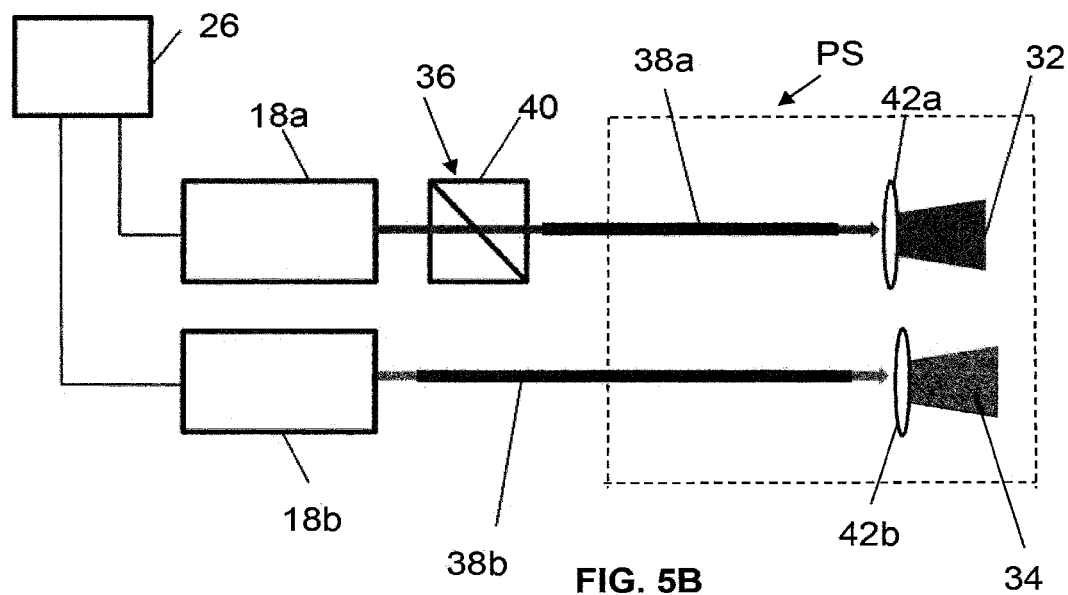
FIG. 5B depicts another embodiment of the system for heating an optical component of a lithographic apparatus.

FIG. 5B schematically depicts another embodiment of the system 16 for heating an optical component of a lithographic apparatus. The exemplary system 16 depicted in FIG. 5B is similar to that depicted in FIG. 5A. The system 16 comprises the first and second lasers 18a, 18b and the apparatus 36. In this embodiment the apparatus 36 is defined or provided by the optical device 40, which is provided in the form of the polarising beam splitter.

In the embodiment depicted in FIG. 5B, the first and second lasers 18a, 18b and the apparatus 36 are arranged outside of the vacuum environment of the projection system PS, which is indicated in FIG. 5B by the dashed line.

The heating radiation that is emitted by the first laser 18a passes through the apparatus 36, where it is p-polarised, as described above, and transmitted into the projection system PS by the first transmission element 38a. The heating radiation emitted by the second laser 18b is transmitted into the projection system PS by the second transmission element 38b.

The system 16 may comprise the first and second optical elements 42a, 42b for directing the heating radiation onto the mirror 14. In this embodiment the first and second optical elements 42a, 42h may be provided as part of the first and second transmission element 38a, 38b. However, it will be appreciated that in other embodiments, the first and second optical elements may be provided or arranged separately from the first and second transmission elements. The controller 26 may be configured to operate the system 16 between the first and second configuration, as described above, for example in relation to the embodiment depicted in FIG. 5A. Additionally, the controller 26 may be configured to vary or change at least one other property of the heating radiation emitted by the first and second lasers 18a, 18b. For example, the controller 26 may be configured to vary or change the intensity or power of the heating radiation emitted by first and second lasers 18a, 18b, as described above.

Figure 6A:
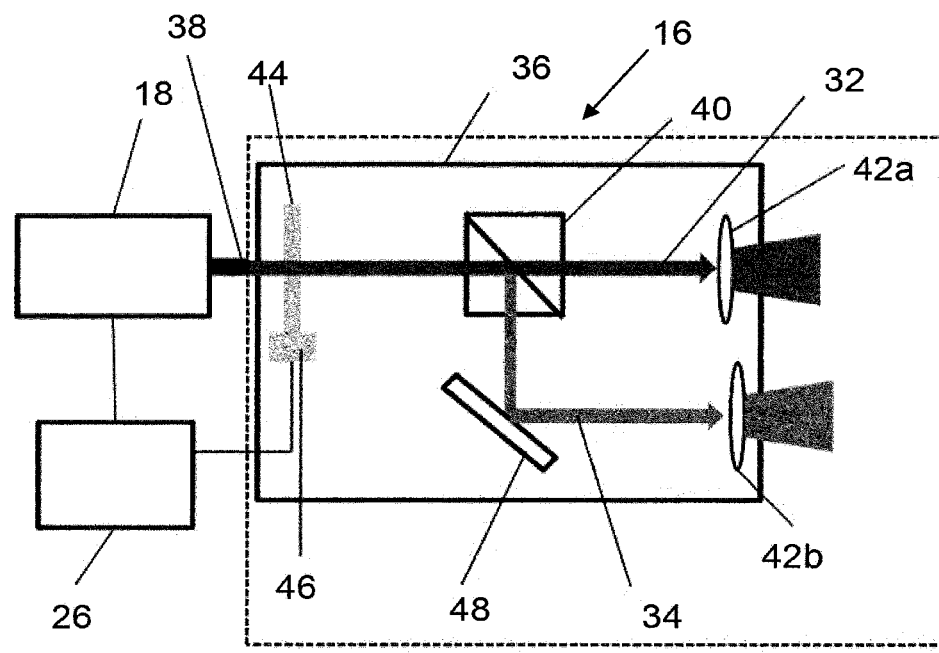
FIG. 6A depicts another embodiment of the system for heating an optical component of a lithographic apparatus.

FIG. 6A schematically depicts another embodiment of the system 16 for heating an optical component of a lithographic apparatus. The system 16 comprises a laser 18 configured to emit heating radiation for heating of the mirror 14. In this embodiment, the laser 18 may be configured to emit heating radiation having a linear polarisation. The system 16 comprises an apparatus 36 for varying or changing at least one property of the heating radiation emitted by the laser 18. The system 16 comprises a transmission element 38, such as for example an optical fibre, for transmitting the heating radiation to the apparatus 36. In the embodiment depicted in FIG. 6A, the laser 18 and/or transmission element 38 may be arranged outside of the vacuum environment of the projection system PS, which is indicated in FIG. 6A by the dashed line. It will be appreciated that in other embodiments, the laser and/or transmission element may be at least partially or fully arranged in the projection system.

The apparatus 36 comprises an optical device 40 for varying or changing the at least one property of the heating radiation emitted by the laser 18. The optical device 40 may be configured for dividing the heating radiation emitted by the laser 18 into the first radiation portion and the second radiation portion, The first radiation portion comprises the first polarisation, which in this embodiment is p-polarised, and the second radiation portion comprises the second polarisation, which in this embodiment is s-polarised. The optical device 40 may be configured to allow transmission of the first radiation portion and to reflect the second radiation portion, e.g. by 90').

The apparatus 36 may comprise a reflection element 48, such as for example a mirror. The reflection element 48 may be arranged to direct the second radiation portion towards the mirror 14. The apparatus 36 may comprise the first optical element 42a and the second optical element 42b, which are arranged for directing the first and second radiation portions, respectively, onto the mirror 14.

The apparatus 36 comprises an attenuating element 44. The attenuating element 44 may be configured to allow a ratio between the first radiation portion and the second radiation portion to be varied or changed. The attenuating element 44 may be provided in the form of a half-wave plate. The attenuating element 44 may be arranged between the laser 18 and the optical device 40. The apparatus 36 may comprise an actuator 46, such as for example a motor. The actuator 46 may be configured to move or rotate the attenuation element 44, for example, to vary or change an intensity or power of the heating radiation emitted by the laser 18. Additionally, rotation of the attenuation element 44 may allow a split ratio of the optical device 40, e.g. the ratio of first and second radiation beams, to be varied or adjusted. For example, rotation of the attenuation element 44 may allow the ratio of the first radiation portion, which comprises p-polarised heating radiation 32, to the second radiation portion, which comprises s-polarised heating radiation 34, to be varied between 1:99 to 99:1. In other words, the attenuation element 44 may allow the amount of the p-polarised heating radiation 32 relative to the amount of the s-polarised heating radiation 34 to be varied, e.g. so that the heat load on the mirror 14 and/or the other component 24 of the lithographic apparatus can be maintained constant during operation of the lithographic apparatus. For example, when no EUV radiation is present in the lithographic apparatus (e.g. in the first configuration thereof) the heating radiation directed onto the mirror 14 by the system 16 may comprise predominately p-polarised heating radiation. When EUV radiation is present in the lithographic apparatus (e.g. in the second configuration thereof), the heating radiation directed onto the mirror 14 by the system 16 may comprise p-polarised light and s-polarised heating radiation.

Additionally, the controller 26 may be configured to vary or change at least one other property of the heating radiation emitted by the lasers 18. For example, the controller 26 may be configured to vary or change the intensity or power of the heating radiation emitted by the lasers 18, e.g. between a first intensity or power and a second intensity or power, e.g. so that the heat load on the mirror 14, e.g. on one or more parts thereof, and/or the other component 24 of the lithographic apparatus is constant during operation of the lithographic apparatus. The second intensity or power may be lower than the first intensity or power.

The system 16 depicted in FIG. 6A may comprise the controller 26. The controller may be in communication the actuator 46 to control the movement or rotation of the attenuation element 44. By controlling the movement or rotation of the actuation element 44, the controller may operate the system 16 between the first and second configuration thereof, as described above.

Figure 6B:
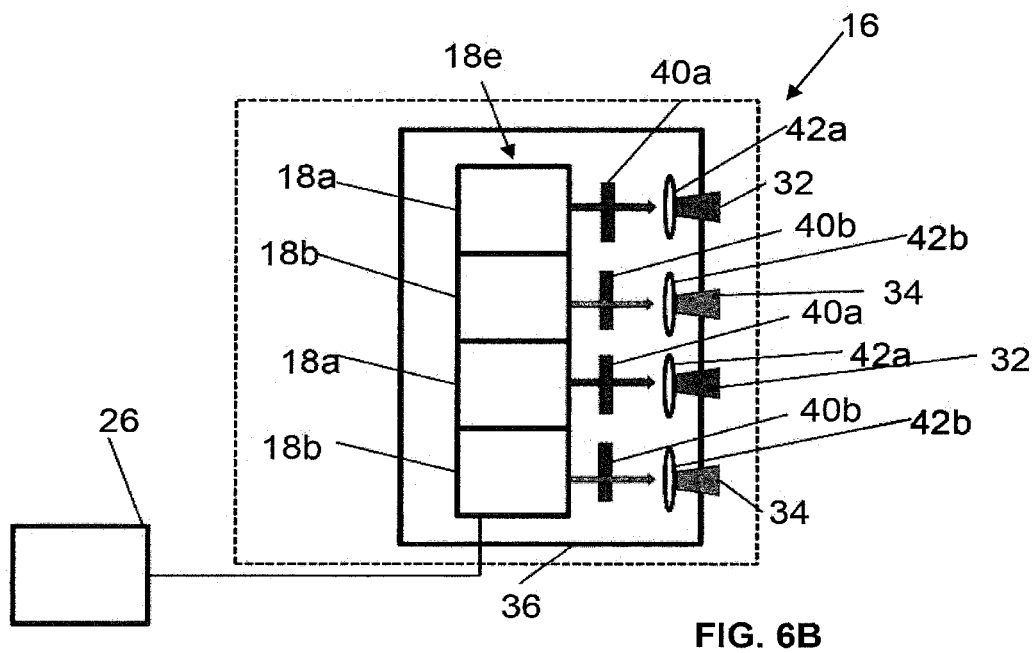
FIG. 6B depicts another embodiment of the system for heating an optical component of a lithographic apparatus.

FIG. 6B schematically depicts another embodiment of the system 16 for heating an optical component of a lithographic apparatus. In the exemplary system 16 depicted in FIG. 6B, the system 16 comprises a plurality of light source, such as for example a plurality of lasers 18a, 18h. Each laser of the plurality of lasers 18a, 18b may be provided in the form of a Vertical-Cavity-Surface-Emitting-Laser (VCSEL). The plurality of lasers 18a, 18h may define an array 18e of lasers. It should be understood that the/each laser of the plurality of lasers described herein is not limited to being provided in the form of a Vertical-Cavity-Surface-Emitting-Laser. For example, in other embodiments other types of lasers, such as for example other types of semiconductor lasers, may be used to provide at least one or each laser of the plurality of lasers.

The system 16 may be configured to vary or change the property of the heating radiation emitted by each laser of the plurality of laser 18a, 18b. The system 16 comprises an apparatus 36 for varying or changing the property of the heating radiation emitted by each laser of the plurality of lasers 18a, 18b. It will be appreciated that in other embodiments the system and/or apparatus may be configured to vary or change the property of the heating radiation emitted by at least one laser or all lasers of the plurality of laser, as for example described above in relation to the embodiments depicted in FIGS. 5A and 5B.

In the embodiment depicted in FIG. 6B, the apparatus 36 comprises a plurality of optical devices 40a, 40h. Each optical device of the plurality of optical devices 40a, 40b is associated with a respective laser of the plurality of lasers 18a, 18b to allow the property of the heating radiation emitted by each laser of the plurality of laser 18a, 18b to be varied or changed. For example, a first optical device 40a may be associated with a first laser 18a to allow at least one property of the heating radiation emitted by the first laser 18a to be varied or changed. A second optical device 40b may be associated with a second laser 18b to allow at least one property of the heating radiation emitted by the second laser 18b to be varied or changed. In this embodiment, the system 16 comprises two first lasers 18a and two second laser 18b. It will be appreciated that in other embodiments, the system may comprise more or less than two first lasers and/or more or less than two second lasers.

The first optical device 40a may be configured to allow passage of heating radiation comprising a first polarisation and the second optical device 40b may be configured to allow passage of heating radiation comprising a second polarisation. In this embodiment, the apparatus 36 comprises two first optical devices 40a and/or two second optical devices 40b. It will be appreciated that in other embodiments, the apparatus may comprise more or less than two first optical devices and/or more or less than two second optical devices.

In this embodiment, the first and second optical devices 40a, 40h may be provided in the form of a polarisation selective element, such as for example a polarising grating. However, it will be appreciated that in other embodiments other optical devices, such as for example a quarter-wave plate, a half-wave plater or a beam splitter, such as a polarising beam splitter, may be used.

Each first optical device 40a may be configured to allow passage of p-polarised heating radiation 32 and each second optical device 40h may be configured to allow passage of s-polarised heating radiation 34.

The apparatus 36 comprises a plurality of optical elements 42a, 42b. Each optical element is associated with a respective laser of the plurality of lasers 18a, 18h or a respective optical device of the plurality of optical devices 40a, 40b. Each optical element of the plurality of optical elements 42a, 42h is arranged to direct heating radiation that passed each optical device onto the mirror 14.

At least one first laser 18a and at least one associated first optical device 40a and at least one second laser 18b and at least one associated second optical device 40b may be arranged for heating of an area or location, such as for example a pre-determined area or location, of the mirror 14.

The system 16 may comprise a first laser 18*a* and a second laser 18*b* with associated respective first and second optical devices 40*a*, 40*h* for nearly each pre-determined area or location of the mirror 14. This may allow heating of one or more parts of the mirror 14.

The system 16 may comprise a controller 26 configured to operate the system 16 between the first configuration, in which the heating radiation that is directed onto the mirror 14 comprises the first property, e.g. the first polarisation state and the second configuration, in which the heating radiation that is directed onto the mirror 14 comprises the second property, e.g. the second polarisation state. For example, the controller 26 may be configured to operate the first and/or second lasers 18*a*, 18*b* so that one or more of the first lasers 18*a* emit heating radiation, which is subsequently p-polarised by the associated first optical device 40*a* and directed onto the mirror 14 by one or more first optical element 42*a*, when no EUV radiation is present in the lithographic apparatus, e.g. the first configuration thereof. When the lithographic apparatus is operated from the first configuration to the second configuration, the controller may operate the system 16 into the second configuration. In the second configuration of the system 16, the controller 26 may be configured to operate one or more of each of the first and second lasers 18*a*, 18*b* so that the first and second lasers 18*a*, 18*b* emit heating radiation. Heating radiation emitted by the one or more first lasers 18*a* may be p-polarised by the one or more associated first optical devices 40*a* and directed onto the mirror 14 by one or more associated first optical elements 42*a*. Heating radiation emitted by the one or more second lasers 18*b* may be s-polarised by the one or more associated second optical devices 40*b* and directed onto the mirror 14 by one or more associated optical second elements 42*b*.

Additionally, the controller 26 may be configured to vary or change at least one other property of the heating radiation emitted by the one or more first and second lasers 18*a*, 18*h*. For example, the controller 26 may be configured to vary or change the intensity or power of the heating radiation emitted by the one or more first and second lasers 18*a*, 18*h*, e.g. between a first intensity or power and a second intensity or power, e.g. so that the heat load on the mirror 14, e.g. on one or more parts thereof, and/or the other component 24 of the lithographic apparatus is constant during operation of the lithographic apparatus The second intensity or power may be lower than the first intensity or power. For example, the controller 26 may be configured to vary or change a ratio between the p-polarised heating radiation 32 and the s-polarised heating radiation 34 to maintain the other portion of the heating radiation that is reflected by mirror 14 constant, when the system 16 is operated into the second configuration. In the embodiment depicted in FIG. 6B, the controller 26 may be arranged outside of the vacuum environment of the projection system PS, which is indicated in FIG. 6B by the dashed line. However, it will be appreciated that in other embodiments the controller may be arranged inside the vacuum environment.

Figure 7A:
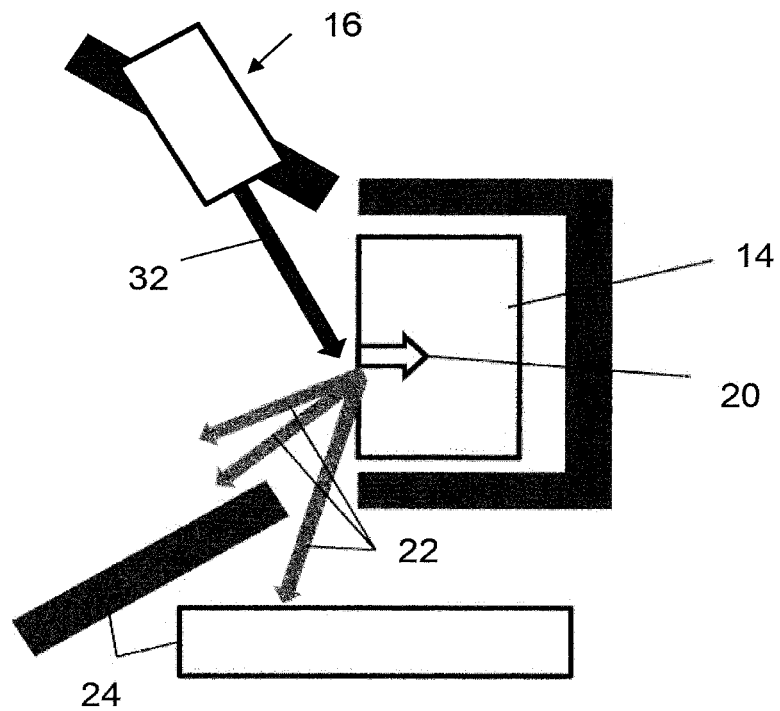
FIG. 7A depicts a system for heating an optical component comprising the system of any one of FIGS. 5A to 6B, when no radiation is present in the lithographic apparatus.
Figure 7B:
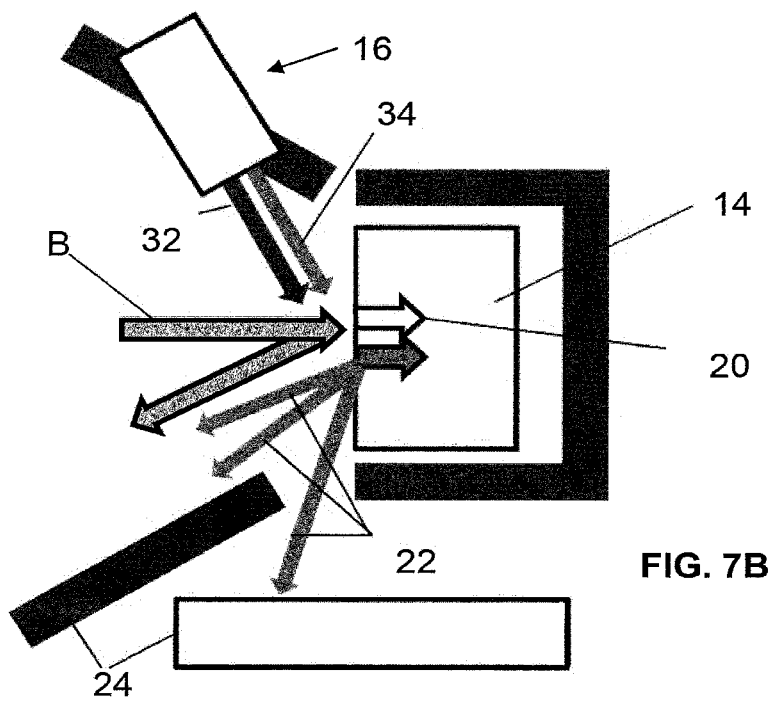
FIG. 7B depicts a system for heating an optical component comprising the system of any one of FIGS. 5A to 6B, when radiation is present in the lithographic apparatus.

FIGS. 7A and 7B schematically depicts a system for heating an optical component of a lithographic apparatus. The system depicted in FIGS. 7A and 7B may comprise any of the systems described above, for example, in relation to FIGS. 5A to 6B.

FIG. 7A schematically depicts the system 16 when no EUV radiation is present in the lithographic apparatus (e.g. the first configuration thereof). As described above, when no EUV radiation is present in the lithographic apparatus, the system 16 may be operated in the first configuration, in which the heating radiation directed onto the mirror by the system 16 comprises the first property. In this embodiment, the heating radiation that is directed by the system 16 onto the mirror 14 comprises the first polarisation state, e.g. comprises polarised or p-polarised heating radiation 32, as described above.

FIG. 7B schematically depicts the system 16 when EUV radiation is present in the lithographic apparatus (e.g. the second configuration thereof). As described above, when EUV radiation is present in the lithographic apparatus, the system 16 may be operated in the second configuration, in which the heating radiation directed onto the mirror by the system 16 comprises the second property. In this embodiment, the heating radiation that is directed by the system 16 onto the mirror 14 comprises the second polarisation state, e.g. comprises polarised or p-polarised heating radiation 32 and unpolarised or s-polarised heating radiation 34, as described above.

As described above, a ratio between the polarised or p-polarised heating radiation 32 and the unpolarised or s-polarised heating radiation 34 may be varied or changed to maintain the other portion of the heating radiation that is reflected by the mirror 14 constant.

Figure 8:
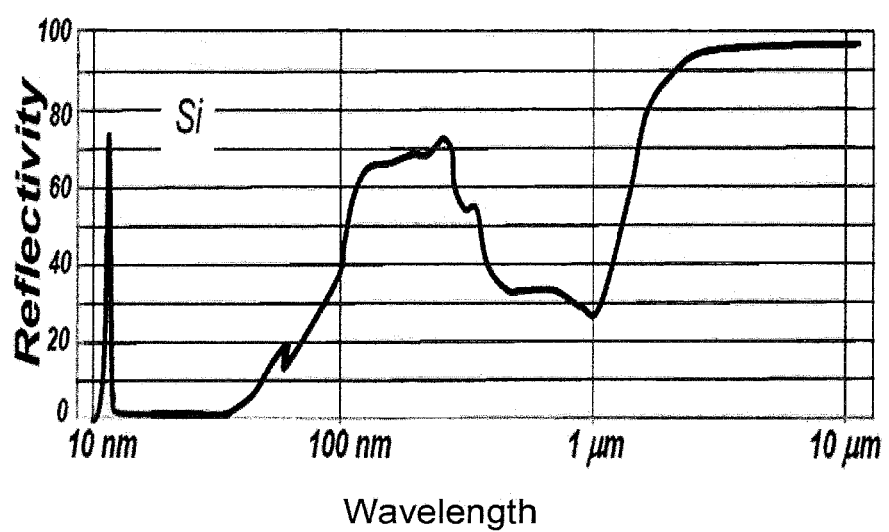
FIG. 8 depicts a graph of the reflectivity of Silicon in dependency of a wavelength of the heating radiation.

FIG. 8 depicts a graph of the reflectivity of Silicon in dependency of a wavelength of heating radiation. The mirror 14 or parts thereof may comprise or be formed of Silicon. For example, the mirror 14 may comprise a layer or coating, such as a reflection layer or coating, which may comprise Silicon. However, it will be appreciated that in other embodiments the mirror may comprise other material in addition or instead of Silicon.

From FIG. 8 it can be seen that the reflectivity of Silicon varies with the wavelength of the heating radiation. For example, in the range of about 500 nm to 10 μm, the reflectivity has a minimum of about 30% at about 1 μm. In other words, 30% of heating radiation comprising a wavelength of about 1 μm is reflected and about 70% of the heating radiation having the wavelength of about 1 μm is absorbed by Silicon. For a wavelength larger than 1 μm the reflectivity increases to above 90%, which in turn means that the absorption of light decreases to about 5%.

Figure 9A:
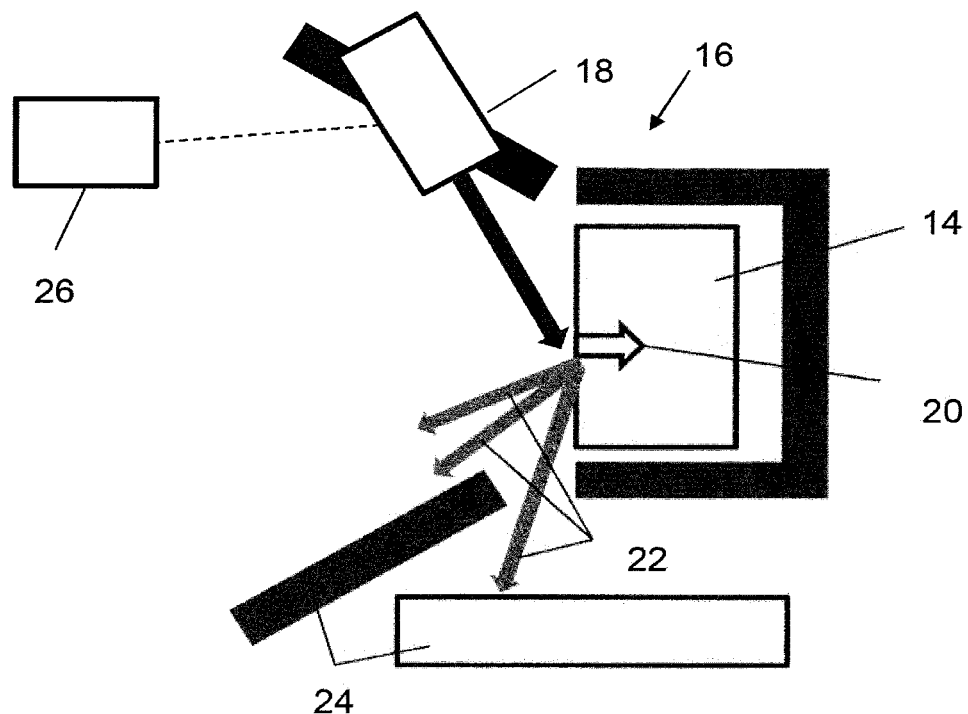
FIGS. 9A and 9B depict another embodiment of the system for heating an optical component of a lithographic apparatus.
Figure 9B:
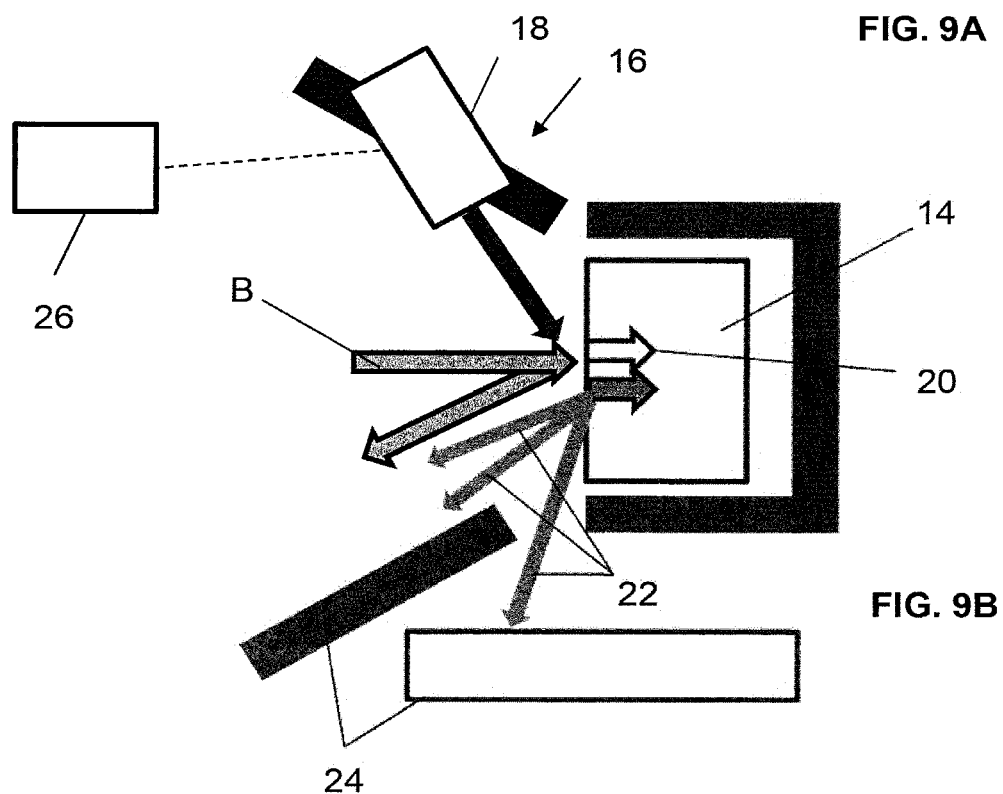

FIGS. 9A and 9B depict another embodiment of the system 16 for heating an optical component of a lithographic apparatus. In the exemplary system depicted in FIGS. 9A and 9B, the laser 18 comprises a tuneable or variable laser 18. The tuneable or variable laser may be configured to emit heating radiation comprising a range of about 0.5 to 10 μm. For example, the laser 18 may be provided in the form of a quantum cascade laser. The tuneable or variable laser may allow the property of the heating radiation emitted by the laser 18 to be varied or changed. It should be understood that the laser disclosed herein is not limited to being provided in the form of a tuneable or variable laser or a quantum cascade laser. It will be appreciated that in other embodiments a wavelength-selective optical device, such as a for example a grating or the like, may be used vary the at least one property, such as for example the wavelength, of the heating radiation emitted by the laser. Referring to FIG. 9A, when no EUV radiation is present in the lithographic apparatus (e.g. the first configuration thereof), the system 16 may be in the first configuration, in which the heating radiation that is directed onto the mirror 14 comprises the first property. In this embodiment, the laser 18 may be configured to emit heating radiation comprising a first wavelength. The first wavelength may be or comprise a wavelength of about 1 μm.

As described above, about 70% of heating radiation having a wavelength of about 1 µm may be absorbed by the mirror 14.

Referring to FIG. 9B, when EUV radiation is present in the lithographic apparatus (e.g. in the second configuration thereof), the system 16 may be in the second configuration, in which the heating radiation that is directed onto the mirror 14 comprises the second property. In the second configuration of the system 16, the laser 18 may be configured to emit heating radiation comprising a second wavelength. The second wavelength may be longer than the first wavelength. The second wavelength may be or comprise a wavelength of about 2 µm. At a wavelength of about 2 µm of the heating radiation, about 10% of the heating radiation may be absorbed and about 90% of the heating radiation may be reflected. This may allow the heat load on the mirror 14 and/or the other component 24 to be kept constant. The first and/or second wavelengths of the heating radiation may be selected such that a different amount or portion of the heating radiation may be absorbed by the mirror 14, e.g. when the system 16 is operated between the first and second configurations. The different amount or portion of the heating radiation that is absorbed by the mirror 14 may allow the heating of the mirror 14 and/or the other component 24 of the lithographic apparatus to be constant.

Additionally or alternatively, the first and/or second wavelengths may be selected based on one or more properties of the laser 18, such as for example the type of laser and/or one or more unwanted wavelengths, and/or one or more properties of the substrate, e.g. the layer of radiation-sensitive material (e.g. resist) provided on the substrate. For example, some wavelengths of the laser may lead to damages in the layer of radiation-sensitive material that is provided on the substrate.

The system 16 depicted in FIGS. 9A and 9B comprises a controller 26. The controller 26 may be configured to operate the system 16 between the first configuration and the second configuration, as described above. Additionally, the controller 26 may be configured to vary or change at least one other property of the heating radiation emitted by laser 18. For example, the intensity or power of the heating radiation emitted by the laser 18 may be varied or changed, e.g. between a first intensity or power and a second intensity or power, e.g. so that the heat load on the mirror 14 and/or the other component 24 of the lithographic apparatus is constant during operation of the lithographic apparatus. For example, in the second configuration of the system 16, the laser 18 may emit heating radiation at a power or intensity that is lower than the power or intensity of the heating radiation emitted by the laser 18 in the first configuration of the system 16. A power or intensity of the laser 18 may be varied between or selected to be in the range of about 1 to 20 W. It will be appreciated that a power or intensity of at least one of the laser, first laser and second laser described above, e.g. in relation to FIGS. 5A to 7B, may also be varied between or selected to be in the range of about 1 to 20 W.

The controller 26 and/or laser 18 may be arranged outside the vacuum environment of the projection system PS. For example, the heating radiation may be directed onto the mirror 14 by one or more transmission elements and/or optical elements (not depicted), as described above. It will be appreciated that in other embodiments, the controller and/or laser may be arranged inside the projection system.

Figure 10A:
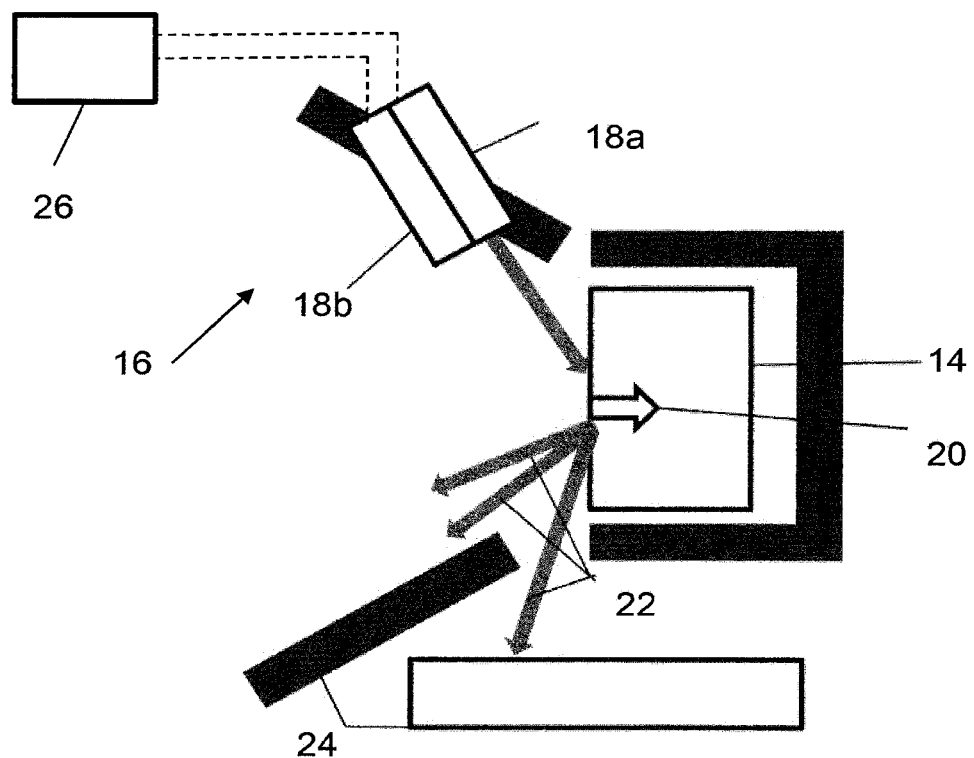
FIGS. 10A and 10B depict another embodiment of the system for heating an optical component of a lithographic apparatus.
Figure 10B:
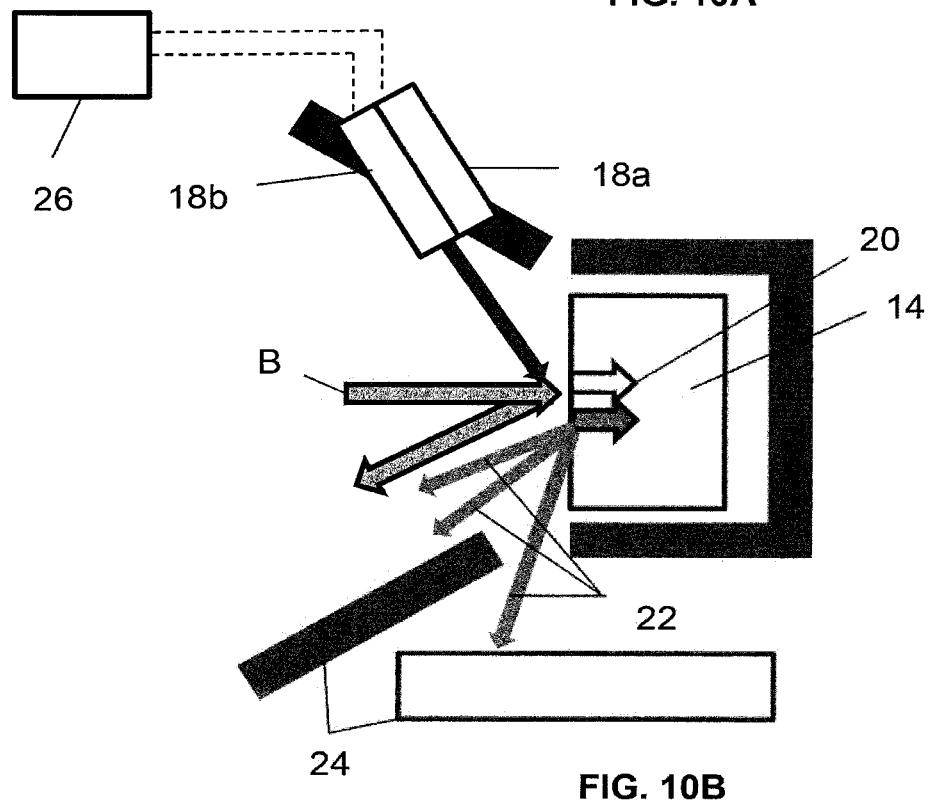

FIGS. 10A and 10B depict another embodiment of the system 16 for heating an optical component of a lithographic apparatus. The embodiment of FIGS. 10A and 10B is similar to that depicted in FIGS. 9A and 9B. However, in this embodiment the system 16 comprises a first laser 18*a* for emitting heating radiation comprising the first property, e.g. the first wavelength, and a second laser 18*b* for emitting heating radiation comprising the second property, e.g. the second wavelength. The second wavelength may be longer than the first wavelength.

Referring to FIG. 10A, when no EUV radiation is present in the lithographic apparatus (e.g. the first configuration thereof), the system 16 may be in the first configuration, in which the heating radiation that is directed onto the mirror 14 comprises the first property. In this embodiment, the first laser 18*a* may be configured to emit heating radiation comprising a first wavelength. The first wavelength may be or comprise a wavelength of about 1 µm. As described above, about 70% of heating radiation having a wavelength of about 1am may be absorbed by the mirror 14.

Referring to FIG. 10B, when EUV radiation is present in the lithographic apparatus (e.g. in the second configuration thereof), the system 16 may be in the second configuration, in which the heating radiation that is directed onto the mirror 14 comprises the second property. In the second configuration of the system 16, the second laser 18*b* may be configured to emit heating radiation comprising a second wavelength. The second wavelength may be longer than the first wavelength. The second wavelength may be or comprise a wavelength of about 2 µm. At a wavelength of about 2 µm of the heating radiation, about 10% of the heating radiation may be absorbed and about 90% of the heating radiation may be reflected. This may allow the heat load on the mirror 14 and/or the other component 24 to be kept constant.

The system 16 depicted in FIGS. 10A and 10B comprises a controller 26. The controller 26 may be configured to operate the system 16 between the first configuration and the second configuration, as described above. Additionally, the controller 26 may be configured to vary or change at least one other property of the heating radiation emitted by first and/or second lasers 18*a*, 18*b*. For example, the intensity or power of the heating radiation emitted by the first and/or second lasers 18*a*, 18*b* may be varied or changed, e.g. between a first intensity or power and a second intensity or power, e.g. so that the heat load on the mirror 14 and/or the other component 24 of the lithographic apparatus is constant during operation of the lithographic apparatus. For example, the second laser 18*b* may emit heating radiation at a power or intensity that is lower than the power or intensity of the heating radiation emitted by the first laser 18*a*. A power or intensity of the first and/or second lasers 18*a*, 18*b* may be varied between or selected to be in the range of about 1 to 20 W. The controller 26 and/or the first and second lasers 18*a*, 18*b* may be arranged outside the vacuum environment of the projection system PS. For example, the heating radiation may be directed onto the mirror 14 by one or more transmission elements and/or optical elements (not depicted), as described above. It will be appreciated that in other embodiments, the controller, first laser and/or second laser may be arranged inside the projection system.

Although specific reference may be made in this text to embodiments of the present disclosure in the context of a lithographic apparatus, embodiments of the present disclosure may be used in other apparatus. Embodiments of the present disclosure may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm. The term "EUV radiation" may be considered as radiation generated or provided by the radiation source SO, as described above.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Further embodiments may be described in the following clauses:

1. A system for heating an optical component of a lithographic apparatus, the system comprising:
   a heating radiation source, the heating radiation source being configured to emit heating radiation for heating of the optical component;
   wherein the system is configured to direct the heating radiation emitted by the heating radiation source onto the optical component, a portion of the heating radiation being absorbed by the optical component and another portion of the heating radiation being reflected by optical component, and wherein the system is configured to vary or change a property of the heating radiation emitted by the heating radiation source such that the other portion of the heating radiation that is reflected by the optical component is constant during operation of the lithographic apparatus.
2. The system of clause 1, wherein the property comprises at least one of the following: a polarisation, polarisation state, intensity, power and wavelength of the heating radiation emitted by the heating radiation source.
3. The system of clause 1 or 2, wherein the system comprises a first configuration, in which the heating radiation directed onto the optical component comprises a first property, and a second configuration, in which the heating radiation directed onto the optical component comprises a second property.
4. The system of clause 3, wherein the first property comprises at least one of a first wavelength, a first polarisation state, a first power and a first intensity and the second property comprises at least one of a second wavelength, a second polarisation state, a second power and a second intensity.
5. The system of clause 4, wherein in the first polarisation state, the heating radiation comprises polarised or p-polarised heating radiation.
6. The system of clause 4 or 5, wherein in the second polarisation state, the heating radiation comprises polarised or p-polarised heating radiation and/or unpolarised or s-polarised heating radiation.
7. The system of any one of clauses 4 to 6 wherein the second wavelength is longer than the first wavelength.
8. The system of any one of clauses 4 to 7, wherein the first wavelength comprises a wavelength of about 1 μm and the second wavelength comprises a wavelength of about 2 μm.
9. The system of any one of clauses 3 to 8, wherein the system comprises a controller, the controller being configured to operate the system between the first configuration and the second configuration.
10. The system of any one of clauses 3 to 9, wherein the controller is configured to operate the system in the first configuration when no radiation, such as extreme ultraviolet radiation, is present in the lithographic apparatus and in the second configuration when radiation, such as extreme ultraviolet radiation, is present in the lithographic apparatus.
11. The system of any one of clauses 6 to 10, wherein when the system is operated from the first configuration to the second configuration, the controller is configured to vary or change a ratio between the polarised or s-polarised heating radiation and the unpolarised or p-polarised heating radiation to maintain the other portion of the heating radiation that is reflected by the optical component constant.
12. The system of any preceding clause, wherein the system comprises an apparatus for varying or changing at least one property of the heating radiation emitted by the heating radiation source.
13. The system of clause 12, wherein the apparatus comprises an optical device for varying or changing the at least one property of the heating radiation emitted by the heating radiation source.
14. The system of clause 13, wherein the optical device is configured for dividing the heating radiation emitted by the heating radiation source into a first radiation portion and a second radiation portion, the first radiation portion comprising a first polarisation and the second radiation portion comprising a second polarisation.
15. The system of clause 14, wherein the apparatus comprises an attenuating element, the attenuating element being configured to allow a ratio between the first radiation portion and the second light portion to be varied or changed.
16. The system of any preceding clause, wherein the system comprises a plurality of heating radiation sources.
17. The system of clause 16, wherein the plurality of heating radiation sources define an array of heating radiation sources.
18. The system of clause 16 or 17, wherein the system is configured to vary or change the property of the heating radiation emitted by at least one heating radiation source of the plurality of light sources or each heating radiation source of the plurality of heating radiation sources.
19. The system of clause 17 or 18, wherein the system comprises an apparatus for varying or changing at least one property of the heating radiation emitted by the at least one heating radiation source of the plurality of heating radiation sources or each heating radiation source of the plurality of heating radiation sources.
20. The system of clause 19, wherein the apparatus comprises an optical device for varying or changing the at least one property of the heating radiation emitted by the at least one heating radiation source of the plurality of heating radiation sources.
21. The system of clause 19 or 20, wherein the apparatus comprises a plurality of optical devices, each optical device being associated with a respective heating radiation source of the plurality of heating radiation sources to allow the at least one property of the heating radiation emitted by each heating radiation source of the plurality of heating radiation sources to be varied or changed.
22. The system of clause 21, wherein the plurality of optical devices comprises a first optical device to configured to allow passage of heating radiation comprising a first polarisation and a second optical device configured to allow passage of heating radiation comprising a second polarisation.
23. The system of clause 22, wherein at least one radiation source of the plurality of radiation sources is associated with the first optical device and at least one other radiation source of the plurality of radiation sources is associated with the second optical device, the at least one radiation source, the at least one other radiation source and the first and/or second optical devices being be arranged for heating of an area or location of the optical component.
24. The system of any one of clauses 1 to 11, wherein the heating radiation source comprises a tuneable or variable heating radiation source to allow the property of the heating radiation emitted by the heating radiation source to be varied or changed.
25. The system of any one of clauses 1 to 11, wherein the system comprises at least two heating radiation sources, at least one of the at least two heating radiation sources being configured for emitting heating radiation comprising the first property and at least one other of the at least two second heating radiation sources being configured for emitting light comprising the second property.
26. The system of clause 9 or any clause dependent thereon, wherein the controller is configured to vary or change at least one other property of heating radiation emitted by the heating radiation source or at least one heating radiation source of the plurality of light sources or each heating radiation source of the plurality of heating radiation sources.
27. A lithographic apparatus comprising:
an illumination system configured to condition a radiation beam;
a support structure constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto the substrate,
wherein the projection system comprises a system for heating an optical component of the lithographic apparatus according to any preceding clause.
28. A method comprising:
emitting heating radiation for heating of an optical component of a lithographic apparatus;
directing the heating radiation onto the optical component; a portion of the heating radiation being absorbed by the optical component and another portion of the heating radiation being reflected by optical component; and varying or changing a property of the emitted heating radiation such that the portion of the heating radiation that is reflected by the optical component is constant during operation of the lithographic apparatus.

Although specific reference may have been made above to the use of embodiments of the present disclosure in the context of optical lithography, it will be appreciated that the disclosed embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present disclosure have been described above, it will be appreciated that the disclosed embodiments may be practiced otherwise than as described. The descriptions above are intended to be illustrative, not limiting. Thus, it will be apparent to one skilled in the art that modifications may be made to the disclosed embodiments as described without departing from the scope of the claims set out below.

What is claimed is:
1. A system for heating an optical component of a lithographic apparatus, the system comprising:
a heating radiation source, the heating radiation source being configured to emit heating radiation for heating of the optical component,
an optical device configured for dividing the heating radiation emitted by the heating radiation source into a first radiation portion and a second radiation portion, the first radiation portion comprising a first polarisation and the second radiation portion comprising a second polarisation, and
an attenuating element, the attenuating element being configured to allow a ratio between the first radiation portion and the second radiation portion to be varied or changed,
wherein the system is configured to direct the heating radiation emitted by the heating radiation source onto the optical component, a portion of the heating radiation being absorbed by the optical component and another portion of the heating radiation being reflected by the optical component, and wherein the system is configured to vary or change a property of the heating radiation emitted by the heating radiation source such that the other portion of the heating radiation that is reflected by the optical component is constant during operation of the lithographic apparatus.
2. The system of claim 1, wherein the property comprises at least one of the following: a polarisation, polarisation state, intensity, power and wavelength of the heating radiation emitted by the heating radiation source.
3. The system of claim 1, wherein the system is configured to be operable between:
a first configuration, in which the heating radiation directed onto the optical component comprises a first property; and
a second configuration, in which the heating radiation directed onto the optical component comprises a second property.
4. The system of claim 3, wherein the first property comprises at least one of a first wavelength, a first polari- sation state, a first power and a first intensity, and the second property comprises at least one of a second wavelength, a second polarisation state, a second power and a second intensity.

5. The system of claim 4, wherein, in the first polarisation state, the heating radiation comprises polarised or p-polarised heating radiation.

6. The system of claim 4, wherein, in the second polarisation state, the heating radiation comprises polarised or p-polarised heating radiation and/or unpolarised or s-polarised heating radiation.

7. The system of claim 4, wherein the second wavelength is longer than the first wavelength.

8. The system of claim 4, wherein the first wavelength comprises a wavelength of about 1 µm and the second wavelength comprises a wavelength of about 2 µm.

9. The system of claim 3, further comprising a controller, the controller being configured to operate the system between the first configuration and the second configuration.

10. The system of claim 9, wherein the controller is configured to operate the system in the first configuration when no radiation, such as extreme ultraviolet radiation, is present in the lithographic apparatus and in the second configuration when radiation, such as extreme ultraviolet radiation, is present in the lithographic apparatus.

11. The system of claim 9, wherein, when the system is operated from the first configuration to the second configuration, the controller is configured to vary or change a ratio between polarised or s-polarised heating radiation and unpolarised or p-polarised heating radiation to maintain the other portion of the heating radiation that is reflected by the optical component constant.

12. The system of claim 1, further comprising an apparatus for varying or changing at least one property of the heating radiation emitted by the heating radiation source.

13. The system of claim 12, wherein the apparatus comprises the optical device, the optical device configured for varying or changing the at least one property of the heating radiation emitted by the heating radiation source.

14. The system of claim 1, further comprising a plurality of heating radiation sources.

15. The system of claim 14, wherein the plurality of heating radiation sources define an array of heating radiation sources.

16. The system of claim 14, wherein the system is configured to vary or change the property of the heating radiation emitted by at least one heating radiation source of the plurality of heating radiation sources or each heating radiation source of the plurality of heating radiation sources.

17. The system of claim 14, wherein the system comprises an apparatus for varying or changing at least one property of the heating radiation emitted by the at least one heating radiation source of the plurality of heating radiation sources or each heating radiation source of the plurality of heating radiation sources.

18. The system of claim 17, wherein the apparatus comprises the optical device, the optical device configured for varying or changing the at least one property of the heating radiation emitted by the at least one heating radiation source of the plurality of heating radiation sources.

19. The system of claim 17, wherein the apparatus comprises a plurality of optical devices, each optical device being associated with a respective heating radiation source of the plurality of heating radiation sources to allow the at least one property of the heating radiation emitted by each heating radiation source of the plurality of heating radiation sources to be varied or changed.

20. The system of claim 19, wherein the plurality of optical devices comprises a first optical device configured to allow passage of heating radiation comprising a first polarisation and a second optical device configured to allow passage of heating radiation comprising a second polarisation.

21. The system of claim 20, wherein at least one radiation source of the plurality of radiation sources is associated with the first optical device and at least one other radiation source of the plurality of radiation sources is associated with the second optical device, the at least one radiation source, the at least one other radiation source and the first and/or second optical devices being arranged for heating of an area or location of the optical component.

22. The system of claim 1, wherein the heating radiation source comprises a tuneable or variable heating radiation source to allow the property of the heating radiation emitted by the heating radiation source to be varied or changed.

23. The system of claim 3, further comprising at least two heating radiation sources, at least one of the at least two heating radiation sources being configured for emitting heating radiation comprising the first property and at least one other of the at least two second heating radiation sources being configured for emitting light comprising the second property.

24. The system of claim 9, wherein the controller is configured to vary or change at least one other property of heating radiation emitted by the heating radiation source or at least one heating radiation source of the plurality of heating radiation sources or each heating radiation source of the plurality of heating radiation sources.

25. A lithographic apparatus comprising:
an illumination system configured to condition a radiation beam;
a support structure constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto the substrate,
wherein the projection system comprises a system for heating an optical component of the lithographic apparatus according to claim 1.

26. A method comprising:
emitting heating radiation for heating of an optical component of a lithographic apparatus, the lithographic apparatus comprising an optical device configured for dividing the heating radiation emitted by a heating radiation source into a first radiation portion and a second radiation portion, the first radiation portion comprising a first polarisation and the second radiation portion comprising a second polarisation, and an attenuating element, the attenuating element being configured to allow a ratio between the first radiation portion and the second radiation portion to be varied or changed;
directing the heating radiation onto the optical component, a portion of the heating radiation being absorbed by the optical component and another portion of the heating radiation being reflected by optical component; and
varying or changing a property of the emitted heating radiation such that the portion of the heating radiation that is reflected by the optical component is constant during operation of the lithographic apparatus.

\* \* \* \* \*